United States Patent [19]
Inoue et al.

[11] Patent Number: 5,325,329
[45] Date of Patent: Jun. 28, 1994

[54] DUAL PORT MEMORY EFFECTING TRANSFER OF DATA BETWEEN A SERIAL REGISTER AND AN ARBITRARY MEMORY BLOCK

[75] Inventors: Kazunari Inoue; Yoshio Fudeyasu, both of Hyogo, Japan

[73] Assignee: Mitsubishi Denki Kabushiki Kaisha, Tokyo, Japan

[21] Appl. No.: 887,253

[22] Filed: May 22, 1992

[30] Foreign Application Priority Data

Dec. 3, 1991 [JP] Japan ................................. 3-319226

[51] Int. Cl.⁵ .............................................. G11C 11/54
[52] U.S. Cl. .............................. 365/189.05; 365/78; 365/189.12; 365/230.09
[58] Field of Search ..................... 365/230.09, 230.03, 365/221, 78, 189.05, 230.06, 205, 189.12, 233, 239, 240

[56] References Cited

U.S. PATENT DOCUMENTS

| | | | |
|---|---|---|---|
| 4,608,666 | 8/1986 | Uchida | 365/222 |
| 4,947,373 | 8/1990 | Yamaguchi et al. | 365/221 |
| 4,984,214 | 1/1991 | Hiltebeitel et al. | 365/230.05 |
| 5,185,724 | 2/1993 | Toda | 365/230.09 |

FOREIGN PATENT DOCUMENTS 503504 9/1992 European Pat. Off. .

*Primary Examiner*—Eugene R. LaRoche
*Assistant Examiner*—Christopher R. Glembocki
*Attorney, Agent, or Firm*—Lowe, Price, LeBlanc & Becker

[57] ABSTRACT

A plurality of transfer bit lines each extend longitudinally across a memory array block. Transfer switch circuits are disposed between the transfer bit lines and a serial register. Transfer switch circuits are disposed between the transfer bit lines and a shared sense amplifier circuit. The transfer switch circuits are controlled by internal transfer signals, respectively. Transfer switch circuits are controlled by internal transfer signals, respectively.

18 Claims, 18 Drawing Sheets

DUAL PORT MEMORY EFFECTING TRANSFER OF DATA BETWEEN A SERIAL REGISTER AND AN ARBITRARY MEMORY BLOCK

BACKGROUND OF THE INVENTION

1. Field of the Invention

The present invention relates to dual port memories including random access memories allowing random access and sequential access memories allowing sequential access, and particularly to an improvement in data transfer in dual port memories.

2. Description of the Related Art

Image information is digitally processed in work stations, personal computers and others. Frame buffer memories called video RAMs (Random Access Memories) are used for displaying such image information on displays. In this case, one row in the video RAM corresponds to one horizontal scanning line in a screen of the display. The frame buffer memory stores the image data of one frame.

Conventional RAMs cannot simultaneously write and read the data. Therefore, if the conventional RAM is used as the video RAM, a CPU (central processing unit) cannot access the video RAM while pixel data is being displayed. The CPU accesses the video RAM only during horizontal retracing. This reduces a data processing rate of the system.

For the above reason, multiport RAMs which allow simultaneous and asynchronous output of the pixel data to the displays and the access by the CPUs have been generally and widely used as memories for image processing.

FIG. 10 schematically shows a construction of a graphic processing system using a multiport memory (multiport RAM).

The system in FIG. 10 employs a typical example of the multiport memory, i.e., a dual port memory 900 which has one randomly accessible RAM port and one serially accessible SAM port. Dual port memory 900 is used as a video RAM for a frame buffer. Dual port memory 900 includes a dynamic random access memory array (will be called as "memory array") 901 which can be accessed in a random sequence and a serial register 902 which can be accessed only in a serial manner.

Generally, a portion including memory array 901 is called as a RAM port, and a portion including serial register 902 is called as a SAM port. Serial register 902 can store data for one row in memory array 901.

CPU 910 accesses dual port memory 900 in the random sequence for carrying out necessary processings. A display 930 displays pixel data supplied from serial register 902. A CRT display controller 920 generates a control signal for controlling an operation of dual port memory 900.

In dual port memory 900, the pixel data for one row is transferred from the RAM port to the SAM port in one transferring operation. While the pixel data for one row is being serially supplied to display 930, CPU 910 can randomly access the RAM port to carry out the necessary operation.

Therefore, if the transfer of data from the RAM port to the SAM port is carried out in the horizontal retracing period, CPU 910 can perform the following operations in a remaining horizontal scanning period. That is; CPU 910 can randomly read the data in memory array 901, also can appropriately process and write the data in memory array 901 again.

An operation timing of dual port memory 900 is controlled by CRT display controller 920. CRT display controller 920 inhibits the access by CPU 910 while the data is being transferred from the RAM port to the SAM port.

In this manner, if dual port memory 900 is used as the video RAM for the frame buffer, CPU 910 can access dual port memory 900 while performing the display on display 930. Therefore, the performance and operation rate of the system are remarkably improved.

FIG. 11 is a block diagram showing an example of a whole construction of the dual port memory. A dual port memory 1 is formed on a semiconductor chip.

In the dual port memory, input and output of data are generally performed by a multiple bit unit, such as 4 bit unit ($\times 4$ construction) or 8 bit unit ($\times 8$ construction). However, FIG. 11 shows a construction which performs inputting and outputting of the data by one bit unit.

In FIG. 11, dual port memory 1 includes a random access memory array (will be called as "memory array") 100 allowing random access and a serial register 300 allowing only serial access. Memory array 100 includes a plurality of dynamic memory cells which are arranged in a matrix form including a plurality of rows and a plurality of columns. Serial register 300 includes a plurality of static memory cells (registers) arranged in one row. Memory array 100 and portions related thereto is called as a RAM port 10. Serial register 300 and portions related thereto are called as a SAM port 30.

An address buffer circuit 400 receives external address signals A0–An supplied to an address input terminal 500, and generates an internal row address signal 400$a$ and an internal column address signal 400$b$ in a time sharing manner. A row decoder 101 is responsive to internal row address signal 400$a$ supplied from address buffer circuit 400 to select a corresponding row in memory array 100. Column decoder 102 is responsive to internal column address signal 400$b$ supplied from address buffer circuit 400 to generate a column selecting signal for selecting one corresponding column in memory array 100.

Sense amplifier circuit 105 senses and amplifies the data read from selected one row in memory array 100. An I/O gate 106 is responsive to column selecting signal supplied from column decoder 102 to transmit one bit in the data for one row amplified by sense amplifier circuit 105 to an I/O common bus 104.

RAM I/O buffer circuit 103 includes an input circuit and an output circuit. In a data reading operation, I/O buffer circuit 103 produces external read data from the data on I/O common bus 104, and transmits the same to an external data I/O terminal 504. In a data writing operation, I/O buffer circuit 103 produces internal write data from external write data supplied to external data I/O terminal 504, and transmits the same to I/O common bus 104.

Transfer circuit 200 transfers the data for one row between an arbitrary row in memory array 100 and serial register 300. A serial selector 302 sequentially selects memory cells in serial register 300. Data read from selected memory cell is supplied to an I/O common bus 304.

A SAM I/O buffer circuit 303 includes an input circuit and an output circuit. In the reading operation of data, I/O buffer circuit 303 produces external read data from the data on I/O common bus 304, and transmits the same to an external data I/O terminal 505. In the writing operation of data, I/O buffer circuit 303 produces internal write data from external write data supplied to external data I/O terminal 505, and transmits the same to I/O common bus 304.

Dual port memory 1 includes, as peripheral circuits, an internal clock generating circuit 401, an SC buffer and shift clock generating circuit 402, and an SE buffer circuit 403.

Internal clock generating circuit 401 receives control signals /RAS, /CAS, /WB; WE, /DT; /OE, which are externally applied from an external clock input terminal 501, to generate various internal control signals. SC buffer and shift clock generating circuit 402 includes a signal converting circuit like a counter, and receives a control signal /SE applied to a control signal input terminal 503 to generate an internal control signal for activating SAM I/O buffer circuit 303.

Control signal /RAS determines timing by which address buffer circuit 400 captures, as the internal row address signal, the external address signal applied to address input terminal 500, and also serves as a row address strobe signal for controlling an operation of row selecting system in RAM port 10. Control signal /CAS determines timing by which address buffer circuit 400 captures, as the internal column address signal, the external address signal applied to address input terminal 500, and also serves as a column address strobe signal for controlling an operation of a column selecting system in RAM port 10.

Control signals /WB and WE are control signals for designating a write per bit operation and a data writing operation. The write per bit operation is a mode in which writing related to a predetermined bit is inhibited when RAM port 10 performs input and output of the data by a multiple bit unit. Control signals /DT and /OE are control signals for designating a data transfer mode in which data is transferred between RAM port 10 and SAM port 20, and designating a data output mode.

Dual port memory 1 further includes an address pointer 410. Address pointer 410 is responsive to the control signal supplied from internal clock generating circuit 401 to latch the internal column address signal supplied from address buffer circuit 400 and apply the same to serial selector 302 as a start address signal 400c.

Then, an operation of dual port memory 1 in FIG. 11 will be described below. RAM port 10 is accessed similarly to the access in a conventional dynamic RAM.

Specifically, at a time of fall of control signal /RAS, external address signals A0-An being applied to address input terminal 500 are captured by address buffer circuit 400, and are applied to row decoder 101 as internal row address signals 400a. Row decoder 101 is responsive to an internal row address signal 400a to select one row in memory array 100, and sets a potential of corresponding row selection line (word line) at an active state of "H". Thereby, data is read from the memory cells in the selected one row. The data for one row is amplified and held by sense amplifier circuit 105.

When, control signal /CAS falls, address buffer circuit 400 captures external address signals A0-An applied to address input terminal 500, and applies the same, i.e., internal column address signals 400b to column decoder 102. Column decoder 102 decodes internal column address signal 400b, and generates the column selecting signal for selecting a corresponding column in memory array 100. Column selecting signal selects one bit in the data for one row held by sense amplifier circuit 105, and the selected data is read through I/O gate 106 to I/O common bus 104.

In the data reading operation, when control signals /DT and /OE are activated to be "L", the output circuit included in RAM I/O buffer circuit 103 is activated. Thereby, external read data is formed from the data on I/O common bus 104, and is supplied to data I/O terminal 504.

In the data writing operation, when control signals /WB and /WE are activated to be."L", the input circuit included in RAM I/O buffer circuit 103 is activated at the timing of fall of the control signal /CAS or the timing of fall of the control signals /WB and /WE which is later. Thereby, the data applied to data I/O terminal 504 is captured to form the internal write data signal, which is transmitted to I/O common bus 104. Since a driving capability of the write data signal is higher than that of the read data signal, the read data amplified by sense amplifier circuit 105 is rewritten and replaced with the write data. In this manner, the data is written in one memory cell in memory array 100.

Then, a data transfer operation as well as data writing and reading operations of SAM port 30 will be described below.

SAM port 30 is selectively set to be in the data reading mode and the data writing mode, depending on a kind of the transfer cycle which was carried out before the setting of the mode. When memory array 100 transmits the data to serial register 300 through transfer circuit 200 (i.e., in the read transfer cycle), SAM port 30 is set in the data reading mode.. When serial register 300 transfers the data to memory array 100 through transfer circuit 200 (write transfer cycle), SAM port 30 is set in the data writing mode.

First, the operation in the data reading mode will be described below.

In the normal reading cycle in RAM port 10, when control signals /DT and /OE are set in the active state "L", control signals /WB and /WE are set in the inactive state "H", and control signal /SE is set in an arbitrary state at the time of activation of the control signal /RAS ("L"), the read transfer cycle starts. Thereby, after the data of the memory cells in one row in memory array 100 is sensed and amplified, transfer circuit 200 is activated in response to the rising of control signals /DT and /OE. Consequently, the data for one row is transferred to serial register 300.

Then, the internal column address signal, which was strobed when control signal /CAS falls, is loaded to address pointer 410. Internal column address signal is applied to serial selector 302 as start address signal 400c. Thereby, an initial selected bit position (selected address) in serial selector 302 is designated.

Thereafter, a signal conversion circuit included in SC buffer and shift clock generating circuit 402 increments the selected address in serial selector 302 one by one. Thereby, the data for one row stored in serial register 300 is sequentially supplied through the output circuit included in SAM I/O buffer circuit 303 to external data I/O terminal 505.

Then, the operation of SAM port 30 in the data writing mode will be described below.

First, at the time of activation ("L") of control signal /RAS, the write transfer cycle starts when control signals /WB and /WE are set in the active state "L", control signals /DT and /OE are set in the active state "L", and control signal /SE is set in the active state "L". Immediately after this, the data of serial register 300 is transferred through transfer circuit 200 to memory array 100.

At this time, row decoder 101 selects one row in memory array 100. Therefore, the data for one row transferred from serial register 300 may compete with the data read from the memory cells in one row selected in memory array 100.

However, an amount of charges supplied from serial register 300 is generally larger than an amount of charges supplied from memory array 100. Consequently, sense amplifier circuit 105 does not amplify the data read from the memory cells in the row selected in the memory array 10, but amplifies the data transferred from serial register 300. Consequently, the data transferred from serial register 300 is written in the memory cells in the row selected in memory array 100.

When control signal /CAS falls to "L", the internal column address signal strobed by address buffer circuit 400 is loaded in the address pointer 410. This internal column address signal is applied to serial selector 302 as start address signal 400c. Thereby, the initial selected bit (selected address) in serial selector 302 is designated.

Thereafter, SC buffer and shift clock generating circuit 402 increments the selected address in serial selector 302 one by one each time external clock signal SC changes. Consequently, the write data applied to external data I/O terminal 505 is sequentially applied to selected address in serial selector 302 through the input circuit included in SAM I/O buffer circuit 303.

As described above, writing of the data in serial register 300 and reading of the data from serial register 300 are carried out in response to external clock signal SC. In this case, it is not necessary to perform the row selecting operation and the column selecting operation, as is done in the conventional dynamic RAM, and thus SAM port 30 is accessed at a high speed in a range from 10 ns to 30 ns. Therefore, the dual port memories have been widely used in the image processing purposes in which a large amount of data must be processed.

In recent years, memory array portions in dynamic RAMs (will be called as "DRAMs") have increased to e.g., 1 Mbits, 4 Mbits and 16 Mbits, and thus the increase of the power consumption has often posed a problem.

FIG. 12 is a diagram for showing a dividing operation of the DRAM. The dividing operation of the DRAM is effective measures for solving the problem of increase of the power consumption.

FIG. 12 shows an example, in which a memory array 1100 having a storage capacity of 1 Mbits is divided into two blocks each having a half storage capacity. FIG. 12 shows an actual arrangement of memory array region AR in FIG. 11.

In FIG. 12, memory array 1100 is divided into two memory array blocks 1100a and 1100b. A serial register 3000 is disposed between two memory array blocks 1100a and 1100b. A sense amplifier circuit 1200a is arranged correspondingly to memory array block 1100a, and a sense amplifier circuit 1200b is arranged correspondingly to memory array block 1100b.

Memory array 1100 corresponds to memory array 100 shown in FIG. 11, and a serial register 3000 corresponds to a serial register 300 shown in FIG. 11. Sense amplifier circuits 1200a and 1200b each correspond to a sense amplifier circuit 105 shown in FIG. 11.

Memory array 1100 is divided such that memory array blocks 1100a and 1100b are disposed in a column direction. Thus, memory array block 1100a includes memory cells from 0th row to 255th row (X0-X255), and memory array block 1100b includes memory cells from 256th row to 511th row (X256-X511).

For example, when a row selection line (word line) 1010 is activated, the data is read from memory cells in one row connected to row selection line 1010, and the data for one row is amplified by sense amplifier circuit 1200a. In this case, sense amplifier circuit 1200a corresponding to memory array block 1100a operates, and sense amplifier circuit 1200b corresponding to memory array block 1100b does not operate. Thus, ½-divisional operation is carried out. This method has been employed in DRAMs of 1 Mbits and is well-known.

In this manner, the power consumption of the DRAMs are reduced.

Then, such a construction will be considered that a DRAM having a memory array in which a ¼-division operation is to be carried out is applied to the dual port memory. FIGS. 13, 14 and 15 are block diagrams showing a construction which can be contemplated when the memory array effecting the ¼-divisional operation is applied to the dual port memory.

First, in FIG. 13, memory array 1100 is divided into four memory array blocks 1100a, 1100b, 1100c and 1100d. Memory array block 1100a includes the memory cells from 0th row to 127th row. Memory array block 1100b includes the memory cells from 128th row to 255th row. Memory array block 1100c includes the memory cells from 256th row to 383th row. Memory array block 1100d includes the memory cells from 384th row to 511th row.

A serial register 1300a is disposed at a side of memory array block 1100a, and a serial register 1300b is disposed between memory array blocks 1100b and 1100c. A serial register 1300c is disposed at a side of memory array block 1100d. Further, a sense amplifier circuit 1200a is disposed between memory array blocks 1100a and 1100b, and a sense amplifier circuit 1200b is disposed between memory array blocks 1100c and 1100d.

Sense amplifier circuits 1200a and 1200b are formed of shared sense amplifier circuits, which are well known and disclosed, e.g., in the Japanese Patent Publication Nos. 61-46918 and 62-55234, in order to reduce occupied areas. Shared sense amplifier circuit 1200a operates for array blocks 1100a and 1100b, and shared sense amplifier circuits 1200b operates for memory array blocks 1100c and 1100d.

In an example in FIG. 13, the serial registers cannot be disposed at one position and are disposed at three positions.

In FIG. 14, serial register 1300a is disposed between memory array blocks 1100a and 1100b, and serial register 1300b is disposed between memory array blocks 1100c and 1100d. Also, sense amplifier circuit 1200a is disposed at a side of memory array block 1100a, and sense amplifier circuit 1200b is disposed between memory array blocks 1100b and 1100c. A sense amplifier circuit 1200c is disposed at a side of memory array block 1100d.

In an example in FIG. 14, the serial registers are disposed at two position. In FIG. 15, sense amplifier circuit 1200a and serial register 1300a are disposed between memory blocks 1100a and 1100b, and sense amplifier circuit 1200b and serial register 1300b are disposed between memory array blocks 1100c and 1100d.

Also in an example in FIG. 15, the serial registers are disposed at two positions. In the dual port memory in FIG. 12 which uses the memory array performing the ¼-divisional operation, the data can be transferred from an arbitrary row in memory array 1100 to serial register 1300, as shown in FIG. 16, and the data can be transferred from serial register 1300 to an arbitrary row in memory array 1100.

However, the data transmitting method is restricted in the dual port memory having the memory array which performs the ¼-divisional operation.

In the construction in FIG. 13, memory array block 1100a can transfer the data only to serial register 1300a, and cannot transfer the data to serial registers 1300b and 1300c, because memory array blocks 1100b, 1100c and 1100d are inactive while memory array block 1100a is operating, and only serial register 1300a is connected to operating memory array block 1100a.

For the same reason, memory array blocks 1100b and 1100c can transfer the data only to serial register 1300b, and memory array block 1100d can transfer the data only to serial register 1300c.

Conversely, serial register 1300a can transfer the data only to memory array block 1100a, and serial register 1300b can transfer the data only to memory array blocks 1100b and 1100c. Serial register 1300c can transfer the data only to memory array block 1100d. The data cannot be transferred in a manner other than those described above.

In the constructions shown in FIGS. 14 and 15, memory array blocks 1100a and 1100b can transfer the data only to serial register 1300a as shown in FIG. 18. Memory array blocks 1100c and 1100d can transfer the data only to serial register 1300b.

Conversely, serial register 1300a can transfer the data only to memory array blocks 1100a and 1100b, and serial register 1300b can transfer the data only to memory array blocks 1100C and 1100d.

As described above, the conventional dual port memory, which uses the memory array performing the ¼-dividing operation, cannot transfer the data between the memory array block and the serial register which are disposed at physically separated positions. As described above, if the divisional operation such as ¼-divisional operation and ⅛-divisional operation is applied to the memory array, the transfer of data between the RAM port and the SAM port is restricted. As the capacity of the DRAM increases to, e.g., 4 Mbits, 16 Mbits and 64 Mbits, the restriction on the data presents a more serious problem.

Further, in the conventional dual port memory 1 in FIG. 11, sense amplifier circuit 105 is required to charge and discharge an excessive load formed of the bit lines and others during the transfer of data from memory array 100 to serial register 300. Therefore, charging and discharging of such load cause an instable state of sense amplifier circuit 105, and a time is required for restoration thereof to a stable state. Also, noise applied to sense amplifier circuit 105 may serve as a trigger, which causes a malfunction such as inversion of the data.

In the conventional dual port memory 1 shown in FIG. 11, data cannot be externally written in serial register 300, while sense amplifier circuit 105 is amplifying the data transmitted from serial register 300 to memory array 100. This unpreferably increases the access time to serial register 300.

SUMMARY OF THE INVENTION

An object of the invention is to enable transfer of data between a serial register and an arbitrary memory block in a dual port memory having a memory array which performs a divisional operation.

Another object of the invention is to reduce time for transfer of data from a memory array to a serial register, while ensuring a stable operation of a sense amplifier circuit in a transfer operation of the data from the memory array to the serial register.

Still another object of the invention is to minimize time in which a writing operation in serial register is inhibited during transfer of data from a serial register to a memory array.

A dual port memory according to the invention comprises a first memory array, an amplifier circuit, a second memory array, and a transfer circuit.

The first memory array includes a plurality of memory cells arranged in rows and columns, and is divided into a plurality of blocks. The amplifier circuit is disposed between the adjacent two blocks, and amplifies data for one row read from one of the blocks or data for one row to be written in one of the blocks. The second memory array includes a plurality of memory cells arranged in one row. The transfer circuit transfers the data for one row between the first memory array and the second memory array.

The plurality of blocks in the first memory array as well as the second memory array are arranged in a common column. The transfer circuit includes a plurality of transfer lines, a first transfer control circuit and a second transfer control circuit. The plurality of transfer lines extend longitudinally across one of the blocks. The first transfer control circuit controls transfer of the data between the amplifier circuit and the plurality of transfer lines. The second transfer control circuit controls transfer of the data between the plurality of transfer lines and the second memory array.

The dual port memory may additionally include a first selection circuit, a second selection circuit and a third selection circuit.

The first selection circuit selects one of the plurality of rows in the first memory array for writing or reading the data. The second selection circuit selects one of the plurality of columns in the first memory array for writing or reading the data. The third selection circuit sequentially selects the memory cells in the second memory array for writing or reading the data. The transfer circuit transfers the data between the memory cells in one row in the first memory array selected by the first selection circuit and the second memory array.

In the dual port memory, the plurality of blocks include first and second blocks. The amplifier circuit is disposed between the first and second blocks. The dual port memory may further include a selection switch circuit. The selection switch circuit selectively couples the first or the second block to the amplifier circuit.

In a data transfer operation of the dual port memory according to the invention, the data is transferred through the plurality of transfer lines between an arbitrary block in the first memory array and the second memory array. Since the plurality of transfer lines extend longitudinally across one of the blocks, the data can be transferred between the arbitrary block and the second memory array which are physically separated from each other.

In a normal operation, by the first transfer control circuit, the plurality of transfer lines are disconnected from the amplifier circuit.

As described above, even if the blocks in the first memory array are physically separated from the second memory array, the data can be transferred between the arbitrary block in the first memory array and the second memory array.

Accordingly, whatever divisional operation the first memory array may perform, the data can be transferred between the first memory array and the second memory array.

A dual port memory according to another aspect of the invention includes a first memory array, an amplifier circuit, a second memory array, and a transfer circuit.

The first memory array includes a plurality of memory cells arranged in rows and columns. The amplifier circuit amplifies data for one row read from the first memory array or data for one row to be written in the first memory array. The second memory array includes a plurality of memory cells arranged in one row. The transfer circuit transfers the data for one row between the first memory array and the second memory array.

The transfer circuit includes a plurality of transfer switches connected between the amplifier circuit and the second memory array, and a control circuit controlling the transfer switches.

The control circuit slowly activates the transfer switches at an initial stage in the transferring operation of the data from the amplifier circuit to the second memory array, and then rapidly activates the same.

In the dual port memory, each of the plurality of transfer switches may include a transistor. The control circuit includes a control signal generating circuit. The control signal generating circuit generates a control signal for controlling each transistor.

In the data transferring operation from the amplifier circuit to the second memory array, the control signal slowly changes at the initial stage and then rapidly changes such that each transistor turns on slowly at the initial stage and rapidly thereafter.

In the dual port memory, the plurality of transfer switches of the first transfer control circuit are slowly activated at the initial stage in the data transferring operation from the first memory array to the second memory array. Therefore, the amplifier circuit operates stably. Thereafter, the plurality of switches of the first transfer control circuit are rapidly activated. Thus, the transfer time is reduced.

As described above, the plurality of transfer switches of the transfer circuit are activated in two stages in the data transferring operation from the first memory array to the second memory array, so that the amplifier circuit can stably operate and the transferring speed can be increased.

According to yet another aspect of the invention, a dual port memory includes a first memory array, a second memory array, a transfer circuit, a dynamic memory circuit, and a control circuit.

The first memory array includes a plurality of memory cells arranged in rows and columns. The second memory array includes a plurality of memory cells arranged in one row. The transfer circuit transfers data for one row between the first memory array and the second memory array. The dynamic memory circuit includes a plurality of dynamic memory cells arranged in one row between the first memory array and the transfer circuit.

The control circuit activates the transfer circuit and the dynamic memory circuit in the data transferring operation from the second memory array to the first memory array, so that the data for one row transferred from the second memory array through the transfer circuit is temporarily stored in the dynamic memory circuit. Thereafter, the control circuit inactivates the transfer circuit.

The dual port memory may further include a first selection circuit and an amplifier circuit.

The first selection circuit selects one of the plurality of rows in the first memory array. The amplifier circuit amplifies data for one row read from the first memory array or data for one row to be written in the first memory array.

The control circuit activates the transfer circuit and the dynamic memory circuit, and then inactivates the transfer circuit. Thereafter, the control circuit activates the amplifier circuit, and further activates the first selection circuit.

The dual port memory may further include a second selection circuit and a third selection circuit.

The second selection circuit selects one of the plurality of columns in the first memory array for writing or reading the data. The third selection circuit sequentially selects the memory cells in the second memory array for writing or reading the data.

In the dual port memory, when the data is transferred from the second memory array to the first memory array, data transferred from the second memory array through the transfer circuit is temporarily stored in the dynamic memory circuit, and the transfer circuit is inactivated. Thereafter, the data stored in the dynamic memory circuit is written in an arbitrary row in the first memory array.

When the transfer circuit is inactivated, writing of the data in the second memory array is immediately allowed. Therefore, a period in which the writing of the data in the second memory array is inhibited is minimized.

As described above, when the data is transferred from the second memory array to the first memory array, the data is temporarily stored in the dynamic memory circuit, so that the period in which the writing of the data in the second memory array is inhibited can be reduced. Therefore, the speed of transfer can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
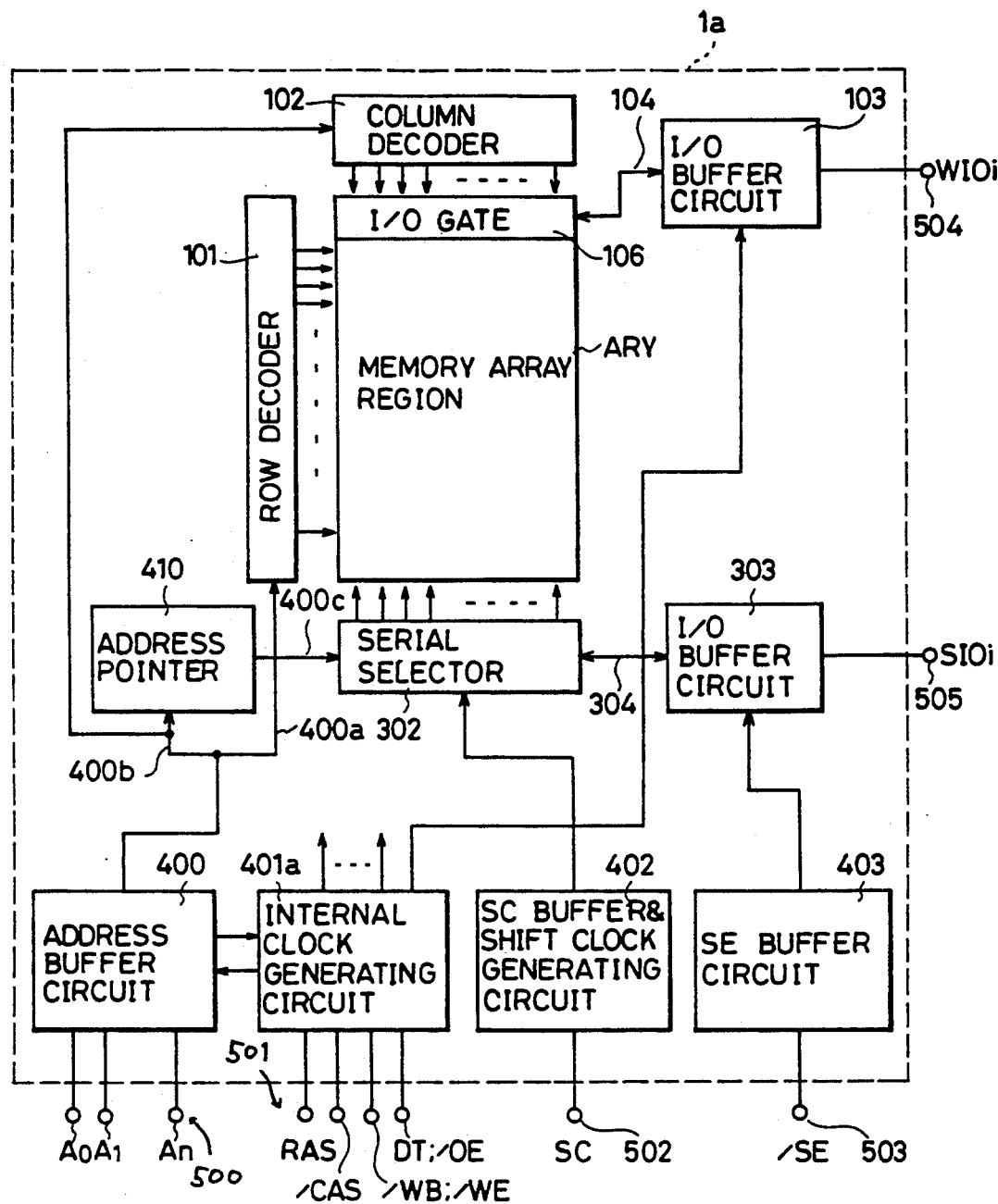
FIG. 1 is a block diagram showing a whole construction of a dual port memory according to a first embodiment of the invention.

A dual port memory 1a in FIG. 1 is formed on a semiconductor chip. Dual port memory 1a in FIG. 1 is different from dual port memory 1 in FIG. 11 in that a memory array region ARY and an internal clock generating circuit 401a have constructions different from those of memory array region AR and internal clock generating circuit 401 shown in FIG. 11. Other constructions are similar to those shown in FIG. 11.

Figure 2:
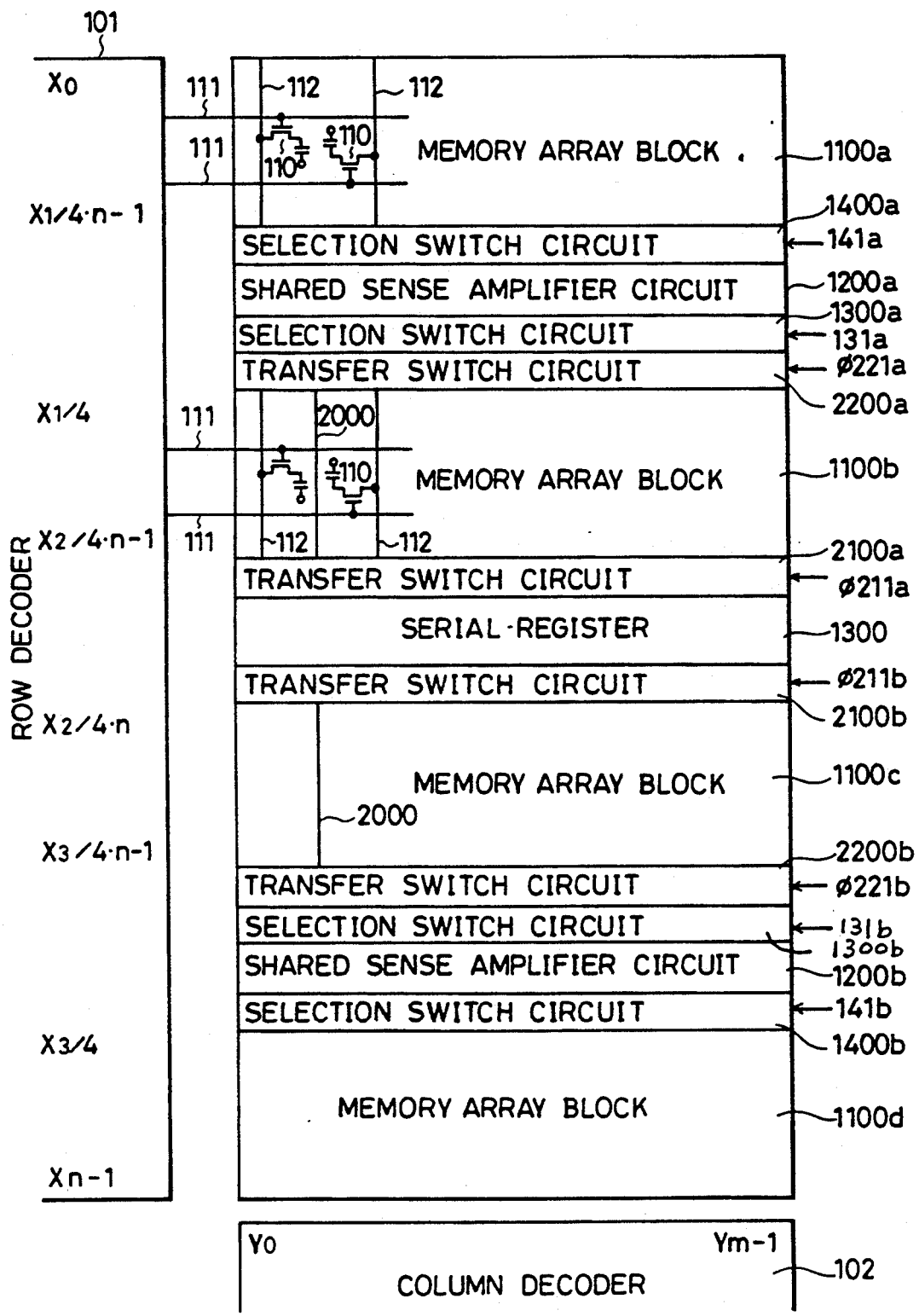
FIG. 2 is a block diagram specifically showing a construction of a memory array region of a dual port memory shown in FIG. 1.

FIG. 2 is a block diagram specifically showing a construction of memory array region ARY shown in FIG. 1. In FIG. 2, a memory array including a plurality of dynamic memory cells arranged in n rows and m columns is divided into four memory array blocks 1100a, 1100b, 1100c and 1100d.

Memory array block 1100a includes memory cells from 0th row to (n/4-1)th row, and memory array block 1100b includes memory cells from (n/4)th row to (2n/4-1)th row. The memory array block 1100C includes memory cells from (2n/4)th row to (3n/4-1)th row, and memory array block 1100d includes memory cells from (3n/4)th row to (n-1)th row.

Memory array blocks 1100a, 1100b, 1100c and 1100d also include memory cells in m columns. As described above, the memory array is divided to have memory array locks 1100a, 1100b, 1100c and 1100d arranged in a column direction.

In each of memory array blocks 1100a-1100d, a plurality of word lines 111 are arranged correspondingly to the rows, and a plurality of bit lines 112 are arranged correspondingly to the columns. A memory cell 110 is arranged at a crossing of each word line 111 and each bit line 112. Adjacent two bit lines 112 form a bit line pair.

Serial register 1300 is disposed between memory array blocks 1100b and 1100c. Shared sense amplifier circuit 1200a is disposed between memory array blocks 1100a and 1100b. Shared sense amplifier circuit 1200b is disposed between memory array blocks 1100C and 1100d.

Selection switch circuits 1400a and 1300a are disposed between memory array block 1100a and shared sense amplifier circuit 1200a, and between memory array block 1100b and shared sense amplifier circuit 1200a, respectively. Selection switch circuits 1300b and 1400b are disposed between memory array block 1100c and shared sense amplifier circuit 1200b, and between memory array block 1100d and shared sense amplifier circuit 1200b, respectively.

Transfer switch circuits 2100a and 2200a are disposed between serial register 1300 and memory array block 1100b, and between memory array block 1100b and shared sense amplifier circuit 1200a, respectively. Transfer switch circuits 2100b and 2200b are disposed between serial register 1300 and memory array block 1100c, and between memory array block 1100C and shared sense amplifier circuit 1200b, respectively.

In a DRAM, a row in the memory array is first selected, and then a column is selected. Therefore, the memory array block to be activated among memory array blocks 1100a-1100d is determined when the row is selected.

In the memory array blocks 1100b and 1100c, a plurality of transfer bit lines 2000 for a transferring operation are provided correspondingly to bit line pairs. Through transfer bit lines 2000, data is transferred between serial register 1300 and shared sense amplifier circuit 1200a, and between serial register 1300 and shared sense amplifier circuit 1200b.

Figure 3:
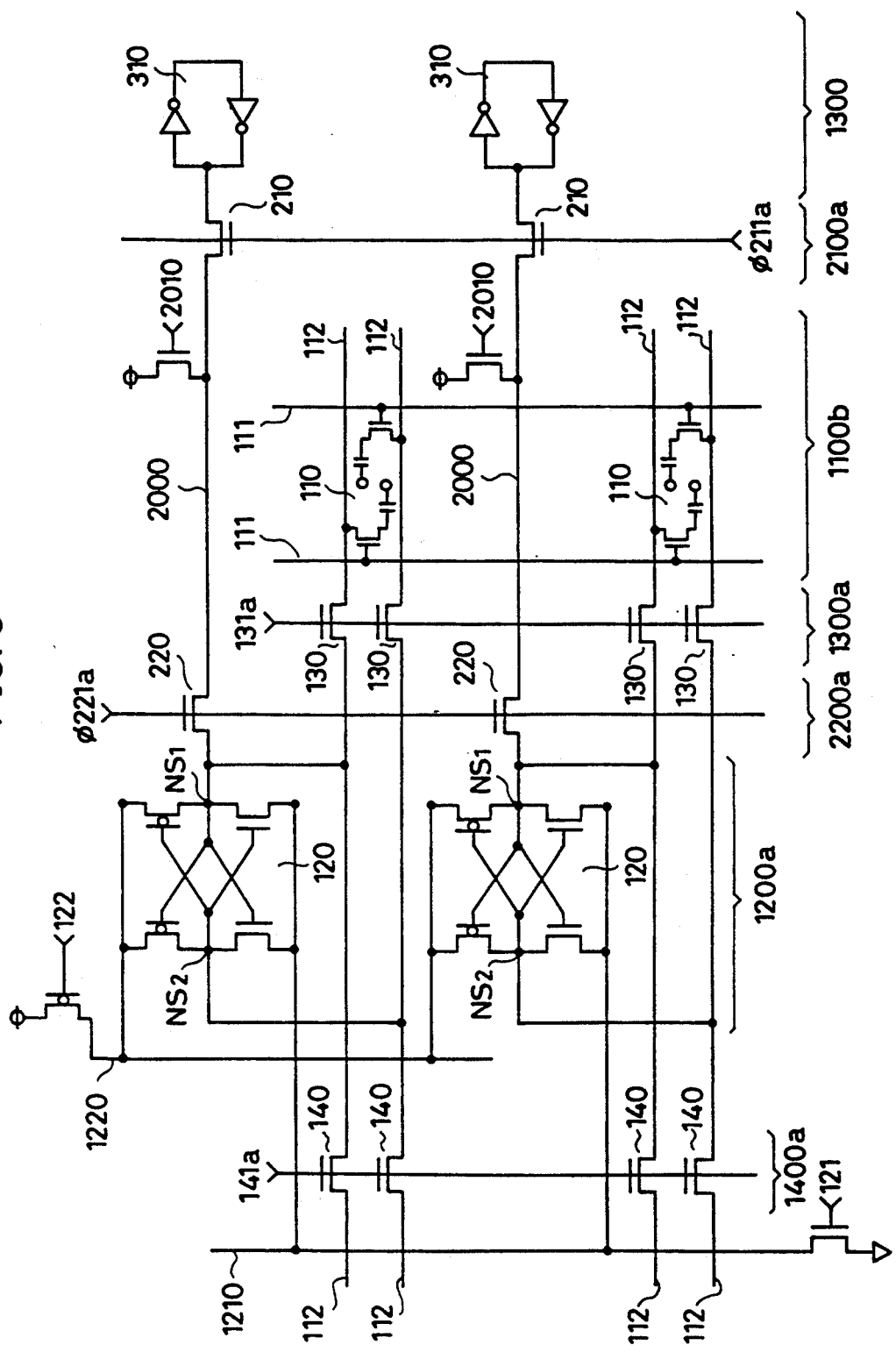
FIG. 3 is a circuit diagram specifically showing one memory array block shown in FIG. 2 and a portion related thereto.

FIG. 3 is a circuit diagram specifically showing memory array block 1100b shown in FIG. 2 and a portion related thereto.

Memory array block 1100b includes a plurality of word lines 111, a plurality of bit lines 112 which cross word lines 111, and dynamic memory cells 110 arranged at crossing of them. Adjacent two bit lines 112 form one bit line pair. Transfer bit lines 2000 are provided correspondingly to the bit line pairs, respectively.

Serial register 1300 includes a plurality of static memory cells (data registers) 310 which correspond to the bit line pairs in memory array block 1100b, respectively.

Transfer switch circuit 2100a includes a plurality of transfer switches 210 formed of N-channel MOS transistors. Transfer switch circuit 2200a includes a plurality of transfer switches 220 formed of N-channel MOS transistors. Transfer switches 210 and 220 have gates which receive internal transfer signals φ211a and φ221a applied from internal clock generating circuit 401a shown in FIG. 1, respectively.

Selection switch circuit 1300a includes a plurality of selection switches 130 formed of N-channel MOS transistors. Selection switch circuit 1400a includes a plurality of selection switches 140 formed of N-channel MOS transistors. Selection switches 130 and 140 have gates, which receive switch signals 131a and 141a supplied from internal clock generating circuit 401a shown in FIG. 1, respectively.

Shared sense amplifier circuit 1200a includes a plurality of sense amplifiers 120. Sense amplifiers 120 are connected to sense amplifier activating lines 1210 and 1220.

Each memory cell 310 in serial register 1300 is connected through transfer switch 210 to corresponding transfer bit line 2000. Each transfer bit line 2000 is connected through transfer switch 220 to a sense node NS1 of corresponding sense amplifier 120.

Paired bit lines 111 and 111 in memory array block 1100b are connected through selection switches 130 and 130 to sense nodes NS1 and NS2 of corresponding sense amplifier 120, respectively. Paired bit lines 112 and 112 in memory array block 1100a (not shown in FIG. 3) are connected through selection switches 140 and 140 to sense nodes NS1 and NS2 in corresponding sense amplifier 120, respectively.

Figure 4:
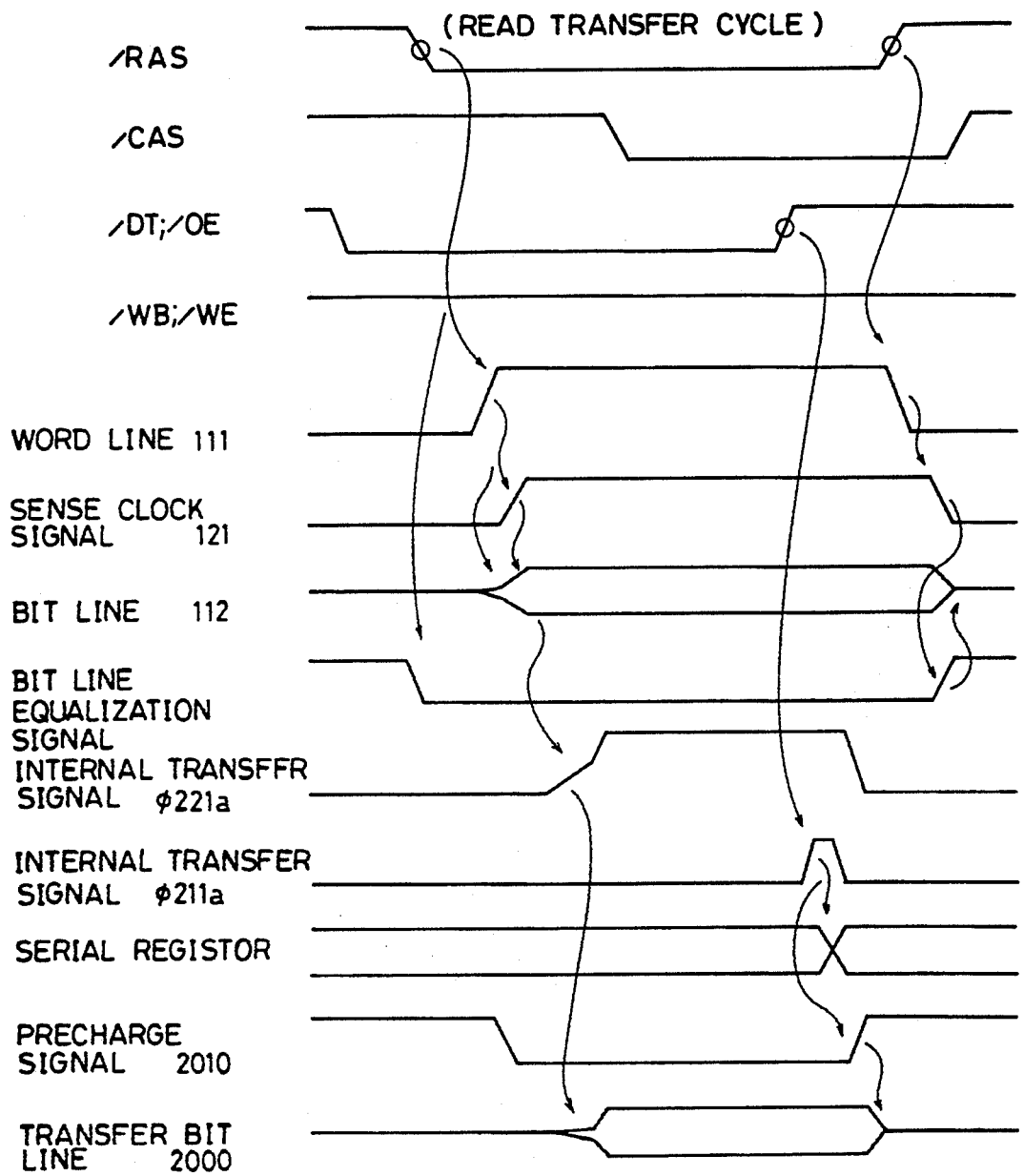
FIG. 4 is a waveform diagram showing an operation in a read transfer cycle.

Then, with reference to a waveform diagram of FIG. 4, an operation of a read transfer cycle of dual port memory in FIGS. 1–3 will be described below.

In response to the fall of a control signal /RAS, a row decoder 101 selects one row in the memory array. Thereby, one of word lines 111 is selected and activated to be "H". It is assumed that word line 111 in memory array block 1110b shown in FIG. 2 is selected.

In this case, switch signal 131a turns on selection switches 130 in selection switch circuit 1300a, and switch signal 141a turns off selection switches 140 in selection switch circuit 1400a. Therefore, bit line pairs in memory array block 1100b are connected to sense amplifiers 120 in shared sense amplifier circuit 1200a, respectively.

Data of "1" or "0" is read from memory cells 110 in one row connected to selected word line 111 to corresponding bit line 112. In accordance with data "1" or "0", the potential of bit lines 112 slightly change to "H" or "L".

When sense clock signals 121 and 122 are activated, only shared sense amplifier circuit 1200a is activated. Thus, the potential difference on each bit line pair in memory array block 1100b is amplified. In this operation, shared sense amplifier circuit 1200b shown in FIG. 2 is not activated.

Then, internal transfer signal $\phi 221a$ slowly rises. Thereby, transfer switches 220 in transfer switch circuit 2200a are slowly rendered conductive. Accordingly, the potential of node NS1 of each sense amplifier 120 is gradually transmitted to corresponding transfer bit line 2000. This prevents the inversion of the data amplified by each sense amplifier 120, and thus the stable operation of sense amplifier 120 is ensured.

Then, internal transfer signal $\phi 221a$ rapidly rises. Accordingly, each transfer switch 220 in transfer switch circuit 2200a rapidly becomes conductive. Consequently, the potential of node NS1 in each sense amplifier 120 is rapidly transmitted to corresponding transfer bit line 2000. This increases the transfer rate of data.

Transfer bit lines 2000 are used only in the transferring operation of data, and are disconnected from serial register 1300 and shared sense amplifier circuit 1200a by transfer switch circuits 2100a and 2200a in the ordinary operation.

Transfer bit lines 2000 have been precharged by precharging signals 2010 to a level of a half of power supply potential Vcc. This prevents malfunction of sense amplifiers 120, which may be caused by discharging of the charges accumulated in capacitors of transfer bit lines 2000, when transfer switches 220 are turned on.

When the potential of transfer bit lines 2000 reach a value enough to rewrite the data in respective memory cells 310 in serial register 1300, internal transfer signal $\phi 211a$ goes to the active state of "H". Thereby, each transfer switch 210 in transfer switch circuit 2100a becomes conductive. Consequently, the potential of each transfer bit line 2000 is transmitted to each memory cell 310 in serial register 1300.

As described above, the transfer of the data from memory array block 1100a to serial register 1300 is performed in the sequence of selection of row, sensing and amplifying, slight turn-on of transfer switches 220, complete turn-on of transfer switches 220, and turn-off of transfer switches 210.

It should be noted that, owing to the existence of transfer bit lines 2000, the data is transferred only to one serial register 1300 independently from the block selected among memory array blocks 1100a–1100d.

The sequence for the transfer from each memory array block to the serial register does not depend on the selected memory array block, but is similar to the foregoing sequence.

As described above, since internal transfer signal $\phi 221a$ changes in two stages, the malfunction such as inversion of data due to noise and others can be prevented, and further the sense amplifiers can stably charge and discharge the excessive load caused by the bit lines and transfer bit lines in a short time.

In the embodiment described above, although internal transfer signals $\phi 221a$ and $\phi 221b$ change in two stages, internal transfer signals $\phi 221a$ and $\phi 221b$ may rise further to the potential higher than the supply potential Vcc. Owing to this change in three stages, the potential of the transfer bit lines 2000 can change fully from the ground potential to supply potential Vcc, resulting in an improved transfer margin.

Figure 11:
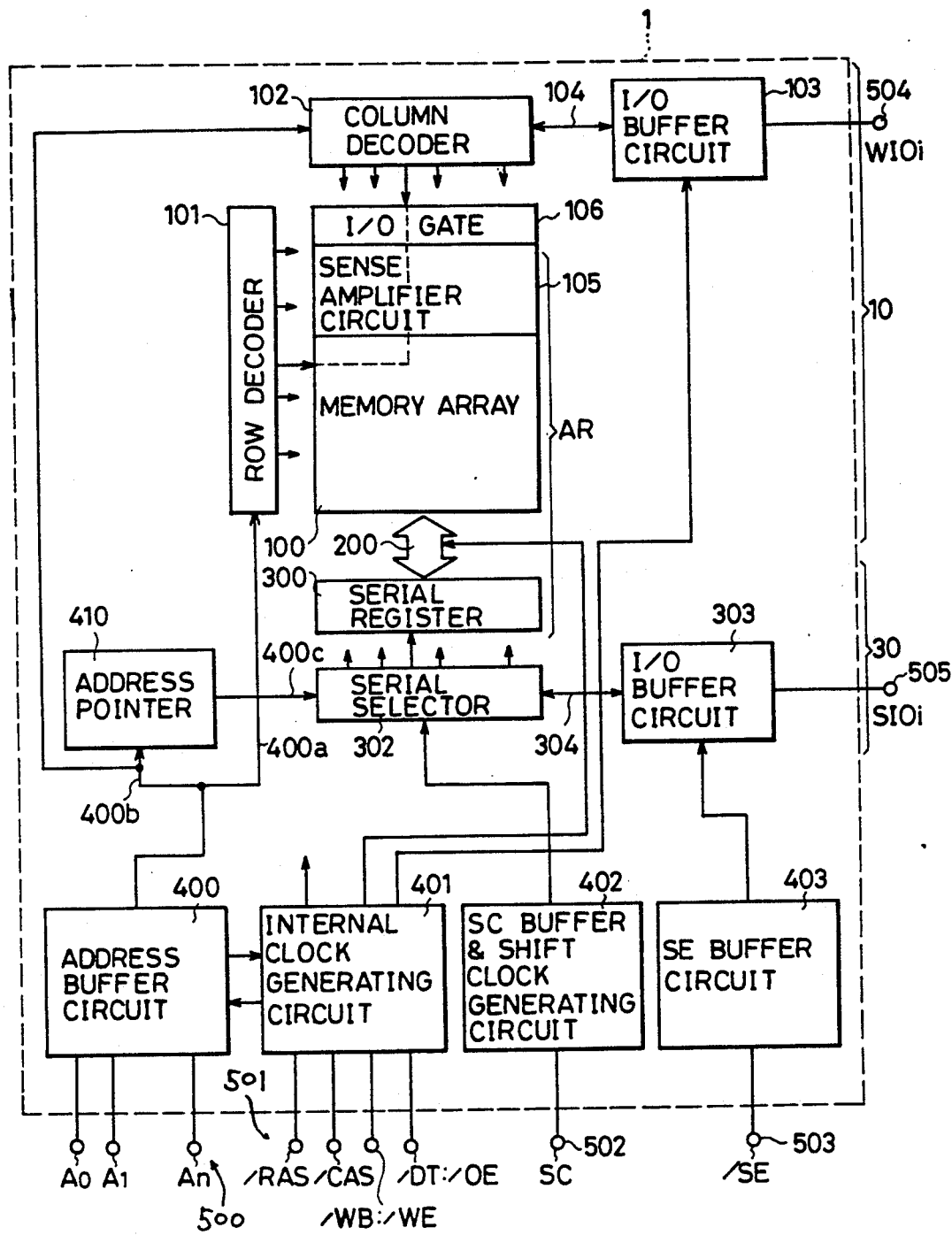
FIG. 11 is a block diagram showing a whole construction of a conventional dual port memory.

The changes of internal transfer signals in two or three stages described above may be applied to the conventional dual port memory shown in FIG. 11. Also in this case, a stable operation of the sense amplifier can be ensured, and the transfer time can be reduced.

Figure 5:
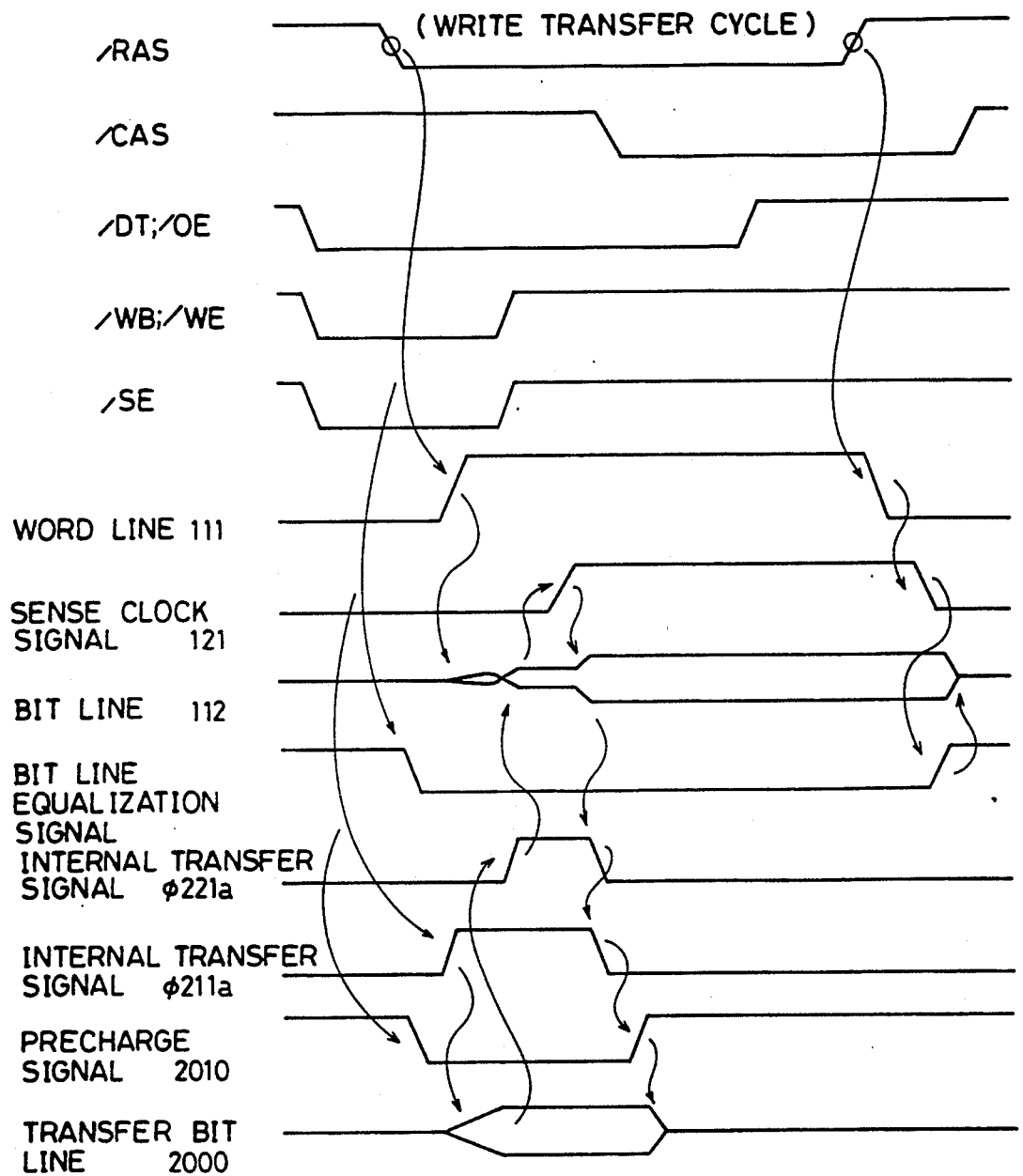
FIG. 5 is a waveform diagram showing an operation in a write transfer cycle.

With reference to a waveform diagram of FIG. 5, an operation in the write transfer cycle of the dual port memory shown in FIGS. 1–3 will be described below.

At the fall of the control signal /RAS, the write transfer mode is set when control signals /WB and /WE are set at "L", control signals /DT and /OE are set at "L", and control signal /SE are set at "L". When address signals A0–An select one row in the memory array, either internal transfer signal $\phi 211a$ or $\phi 211b$ is immediately activated.

When one row in memory array block 1100a or 1100b is selected, internal transfer signal $\phi 211a$ rises, and each transfer switch 210 in transfer switch circuit 2100a is turned on. When one row in memory array block 1100c or 1100d is selected, internal transfer signal $\phi 211b$ rises, and each transfer switch in transfer switch circuit 2100b is turned off.

It is assumed that one row in memory array block 1100a is selected, and thus internal transfer signal $\phi 211a$ turns on each transfer switch 210 in transfer switch circuit 2100a. In this case, transmmision of data stored in each memory cell 310 in serial register 1300 to each transfer bit line 2000 starts.

Meanwhile, the potential of one word line 111 in memory array block 1100a rises to "H". Correspondingly, reading of the data of memory cells 110 connected to word line 111 having the raised potential starts to be read to corresponding bit lines 112 starts.

After the potential of each transfer bit line 2000 changes to "H" or "L" to some extent, internal transfer signal φ221a rises to "H". Thereby, each transfer switch 220 in transfer switch circuit 2200a starts turning on.

Following two points should be noted. First, an amount of the charge read from each memory cell 310 in serial register 1300 to transfer bit line 2000 is larger than the amount of charge which is read from each memory cell 110 in the memory array to bit line 112. Second, each sense amplifier 120 is not activated until each transfer switch 220 in transfer switch circuit 2200a is turned on. Unless the above two points are satisfied, the data cannot be transferred from serial register 1300 to the memory array.

Accordingly, logic is constructed in such a manner that, only in the write transfer cycle, the respective sense amplifiers in shared sense amplifier circuits 1200a and 1200b are not activated, until the transfer switches in the transfer switch circuits 2200a and 2200b are turned on by internal transfer signals φ221a and φ221b.

. As described above, transfer switch 220 in transfer switch circuit 2200a is turned on when the amount of charges, which is read to each transfer bit line 2000 from each memory cell 310 in serial register 1300, becomes larger than the amount of charges, which is read from memory cell 110 in the memory array to each bit line 112. More specifically, conversely to the read transfer cycle, each transfer switch 220 in transfer switch circuit 2200a is turned on with a predetermined time difference after transfer switch 210 in the transfer switch circuit 2100a is turned on.

Thereafter, when each sense amplifier 120 is activated by sense clock signal 121, each sense amplifier 120 does not amplify the data read from memory cells 110 connected to selected word line 111, but amplifies the data read from each memory cell 310 in serial register 1300. The amplified data is written in corresponding memory cells 110. Thus, the transfer of data from serial register 1300 to memory array block 1100a is completed.

As described above, the transfer of data from serial register 1300 to memory array block 1100a is performed in a sequence of turning-on of transfer switches 210, turning-off of transfer switches 220, sensing and amplifying.

Figure 6:
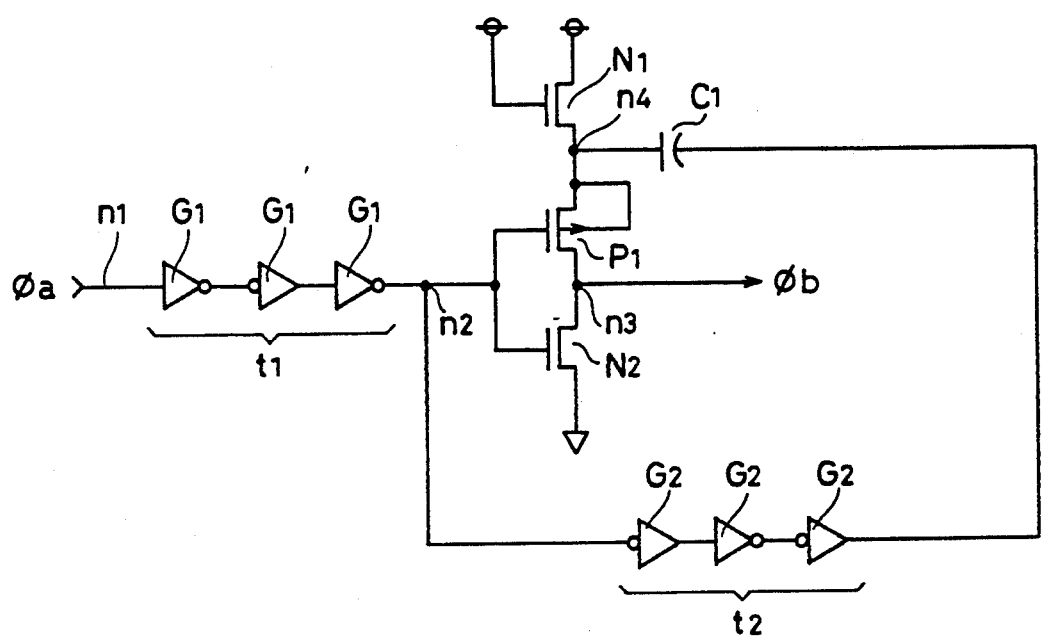
FIG. 6 is a circuit diagram showing a construction of an internal transfer signal generating circuit.
Figure 7:
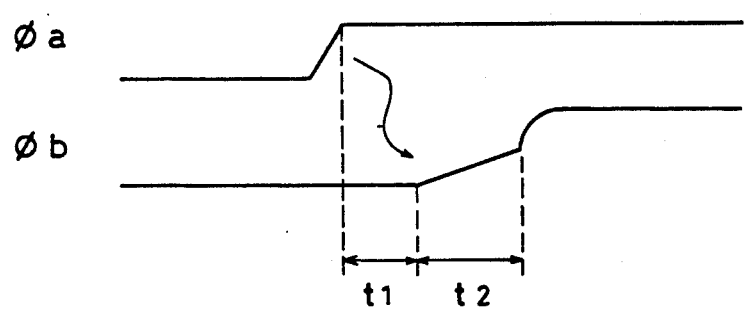
FIG. 7 is a waveform diagram for showing an operation of an internal transfer signal generating circuit.

FIG. 6 is a circuit diagram showing a construction of the internal transfer signal generating circuit (transfer gate boost circuit) for generating internal transfer signals φ221a and φ221b in the read transfer cycle. FIG. 7 is a waveform diagram for showing an operation of the internal transfer signal generating circuit in FIG. 6.

In FIG. 6, an input signal φa corresponds to sense clock signal 121, and an output signal φb corresponds to internal transfer signal φ221a or φ221b.

Internal transfer signal generating circuit includes inverters G1 and G2, N-channel MOS transistors N1 and N2, a P-channel MOS transistor P1 and a capacitor C1. Three inverters G1 are connected between node n1 and node n2. A circuit formed of transistors P1, N1 and N2 is connected between nodes n2 and n3. Three inverters G2 and capacitor C1 are connected between node n2 and n4. Node n1 receives input signal φa, and node n3 supplies output signal φb.

As shown in FIG. 7, when input signal φa rises, output signal φb slowly rises after a delay time t1 determined by three inverters G1. Output signal φb rapidly rises after a delay time t2 determined by three inverters G2.

In this manner, internal transfer signal generating circuit shown in FIG. 6 produces internal transfer signals φ221a and φ221b in the read transfer cycle.

Figure 8:
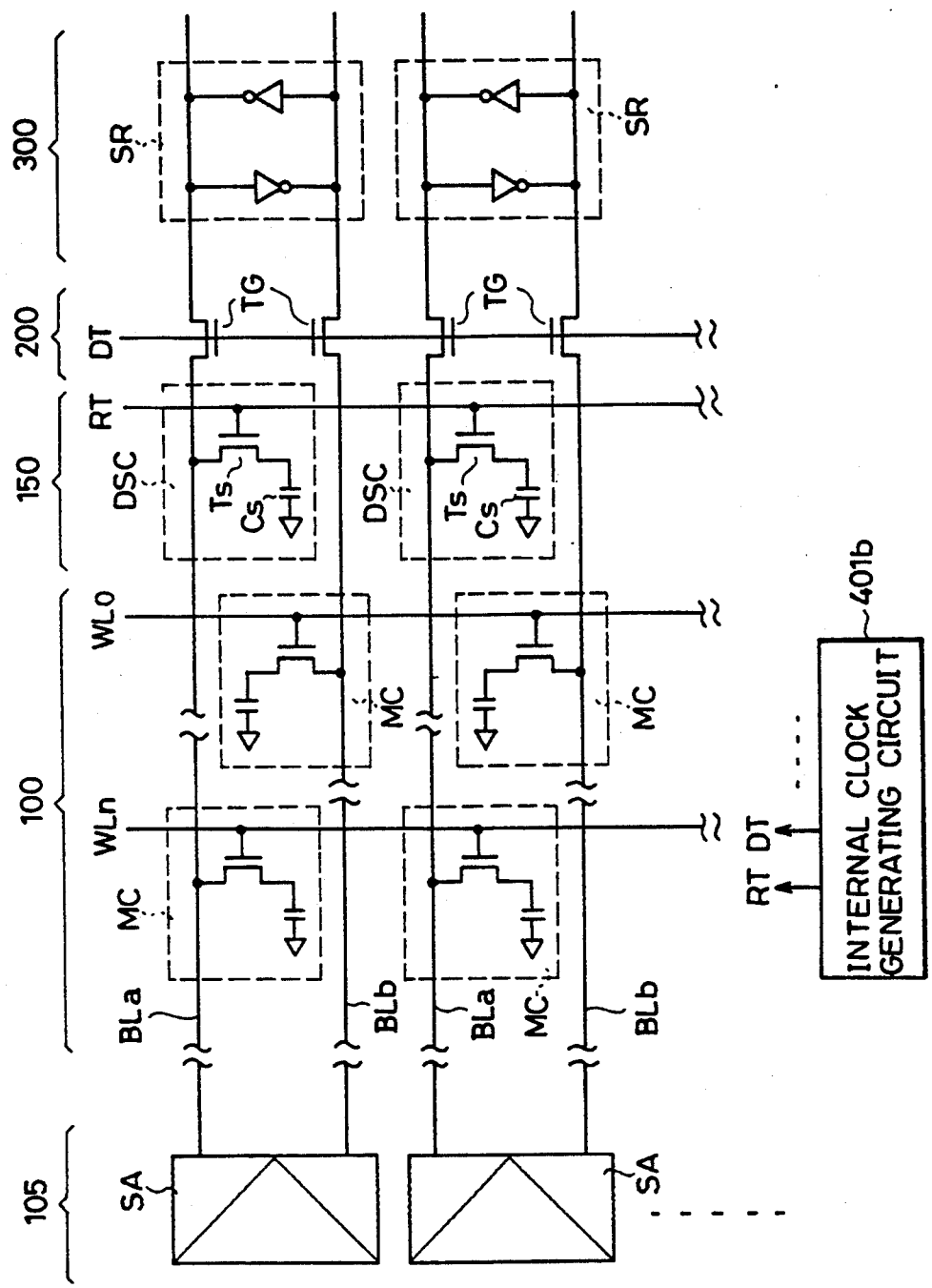
FIG. 8 is a circuit diagram showing a construction of a dual port member according to a second embodiment of the invention and a peripheral portion thereof.

FIG. 8 is a circuit diagram showing a construction of a major part of the dual port memory according to a second embodiment of the invention. The whole construction of the dual port memory in this embodiment is similar to that shown in FIGS. 11 and 12 except for a circuit shown in FIG. 8.

In FIG. 8, a memory array 100 includes a plurality of bit line pairs BLa and BLb, a plurality of word lines WL0-WLn crossing the bit line pairs, and a plurality of memory cells MC arranged at crossings thereof.

A sense amplifier circuit 105 includes a plurality of sense amplifiers SA corresponding to bit line pairs BLa and BLb. Transfer circuit 200 includes a plurality of sets of transfer gates TG, which are formed of N-channel MOS transistors and correspond to bit line pairs BLa and BLb, respectively. Serial register 300 includes a plurality of static memory cells SR which correspond to a plurality of sets of bit line pairs BLa and BLb, respectively.

A dynamic memory circuit 150 is arranged between memory array 100 and transfer circuit 200. Dynamic memory circuit 150 includes a plurality of dynamic storage cells DSC which correspond to a plurality of sets of bit line pairs BLa and BLb, respectively. Each dynamic storage cell DSC includes an N-channel MOS transistor Ts and a capacitor Cs. Each transistor Ts is connected between corresponding bit line BLa and corresponding capacitor Cs.

Each transfer gate TG in transfer circuit 200 receives a data transfer signal DT from an internal clock generating circuit 401b. Each transistor Ts in dynamic memory circuit 150 receives at its gate an activation signal RT from internal clock generating circuit 401b.

Then, with reference to a waveform diagram in FIG. 9, an operation for the write transfer cycle of the dual port memory in FIG. 8 will be described below.

Since each memory cell SR in serial register 300 is formed of a flip-flop, it has two stable states. It is assumed that data "H" is stored when memory cell SR is in one of the two stable states, and that data "L" is stored when memory cell SR is in the other stable state.

First, activation signal RT rises. In response, transistor Ts in each dynamic storage cell DSC is turned on, and capacitor Cs is coupled to corresponding bit line BLa. The data stored in each dynamic storage cell DSC in this time has no relation with operations after this time.

Then, data transfer signal DT rises. In response, each transfer gate TG in transfer circuit 200 is turned on. Consequently, each memory cell SR in serial register 300 is coupled through bit line BLa to capacitor Cs in corresponding dynamic storage cell DSC.

Thereby, the data in each memory cell SR is transferred through transfer gate TG to corresponding dynamic storage cell DSC. After a predetermined transfer time t, data transfer signal DT falls. Thus, each memory cell SR is electrically released from each bit line pair BLa and BLb in memory array 100. Consequently, external data can be written in each memory cell SR in serial register 300.

Figure 9:
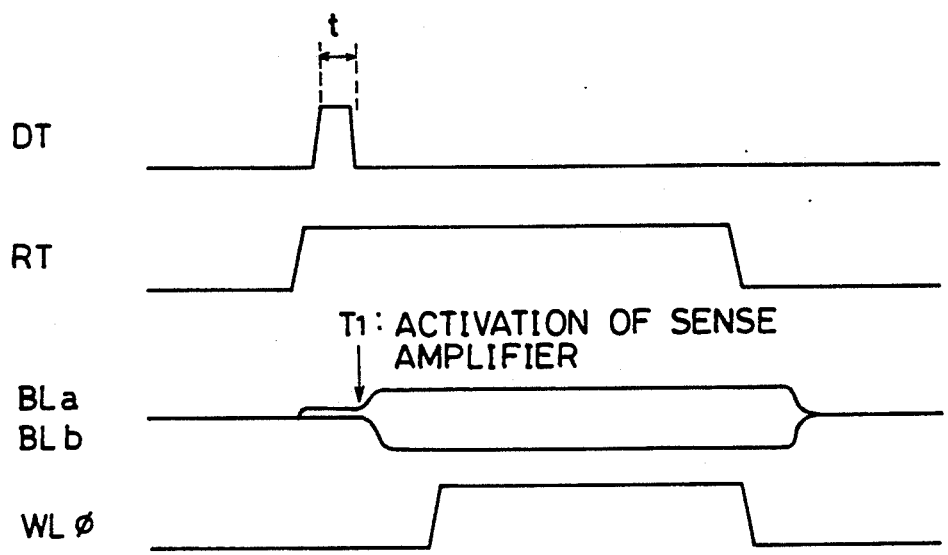
FIG. 9 is a waveform diagram for showing an operation in a write transfer cycle in an embodiment in FIG. 8.
Figure 10:
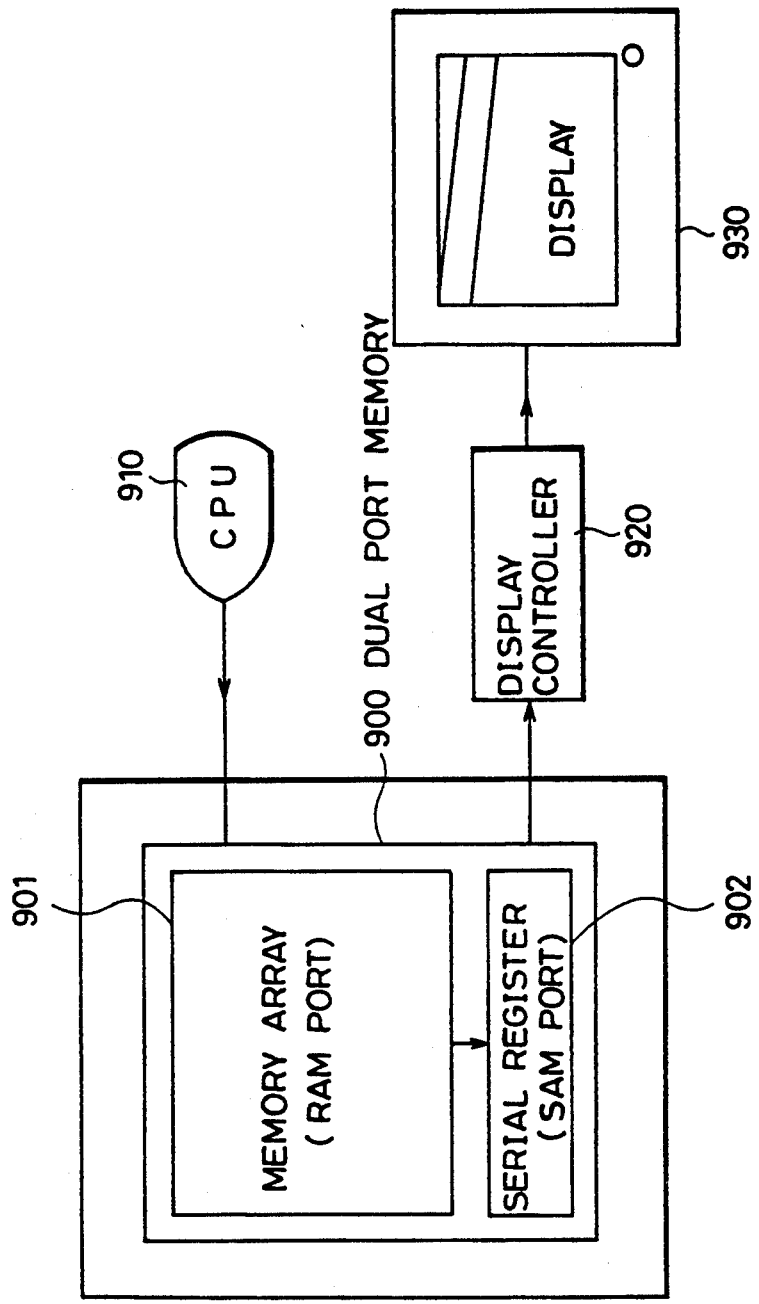
FIG. 10 schematically shows a construction of a graphic processing system using a multiport memory.

Transfer time t shown in FIG. 9 is required for charging a small capacity in each dynamic storage cell DSC. Therefore, transfer time t can be extremely short.

Thereafter, sense amplifier SA is activated at time T1. Thus, the data stored in dynamic storage cell DSC is amplified by sense amplifier SA. When a word line (e.g., line WL0) is activated thereafter, data for one row amplified by sense amplifier SA is written in memory cells MC connected to active word line WL0. In this manner, the transfer of data for one row from serial register 300 to memory array 100 is completed.

Figure 12:
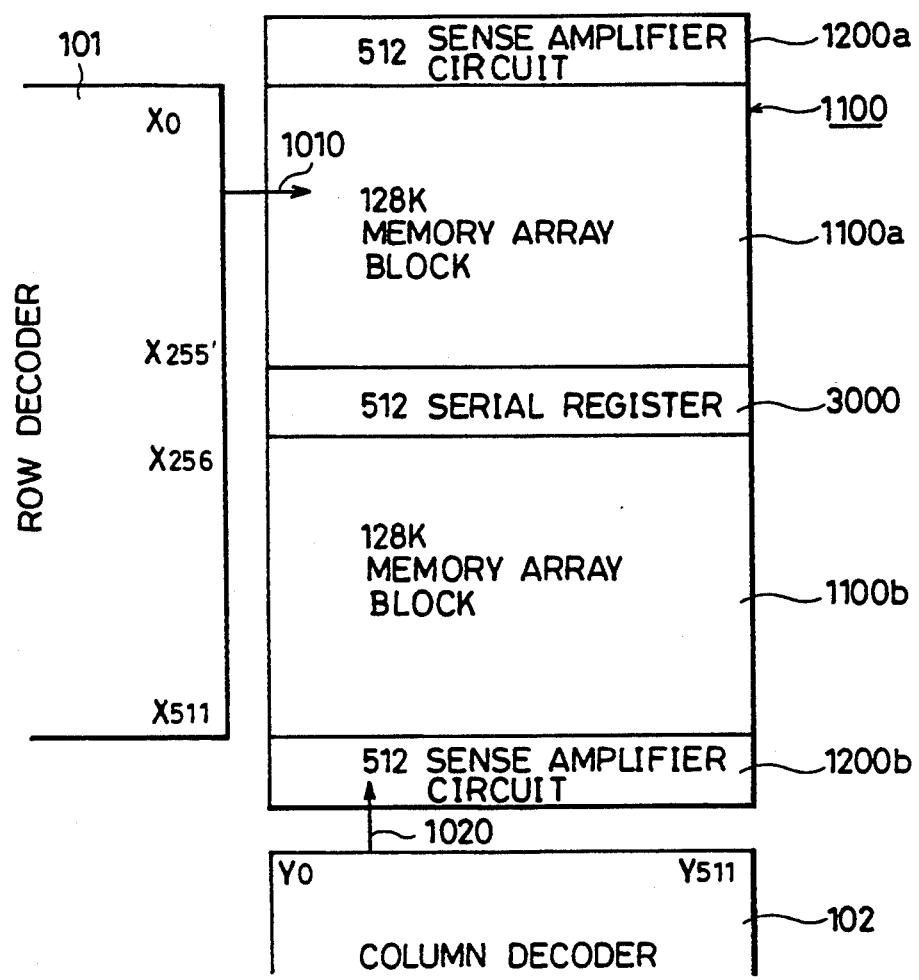
FIG. 12 is a block diagram showing a construction of a memory array region in a dual port memory.
Figure 13:
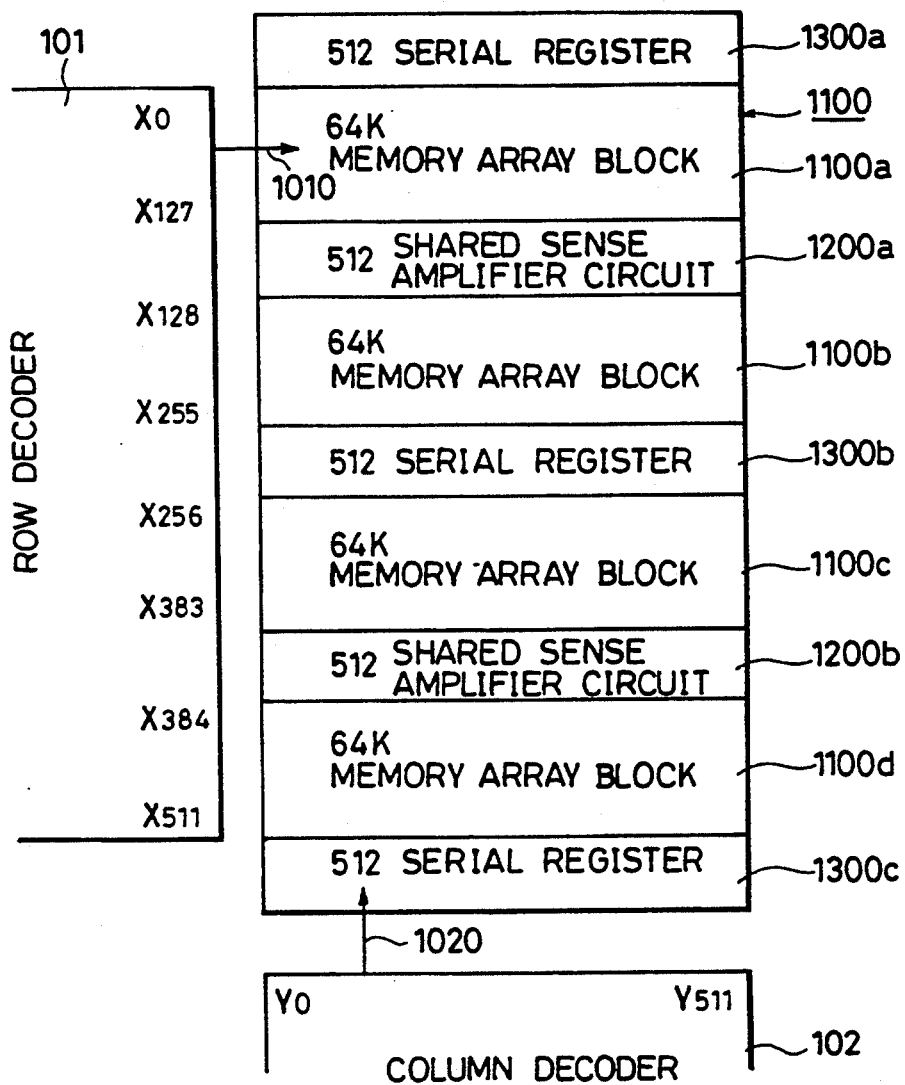
FIG. 13 is a block diagram showing an arrangement which can be contemplated for a memory array allowing a ¼-divisional operation.
Figure 14:
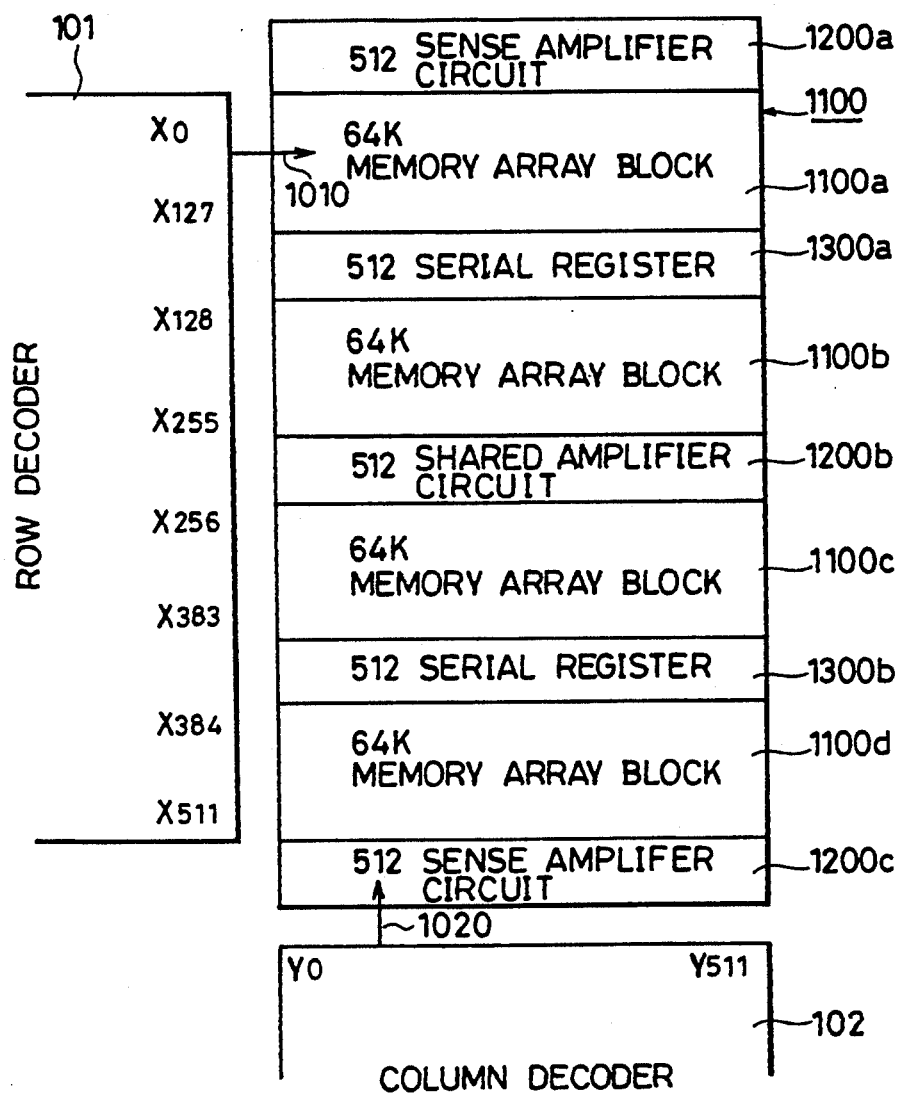
FIG. 14 is a block diagram showing another arrangement which can be contemplated for a memory array allowing a ¼-divisional operation.
Figure 15:
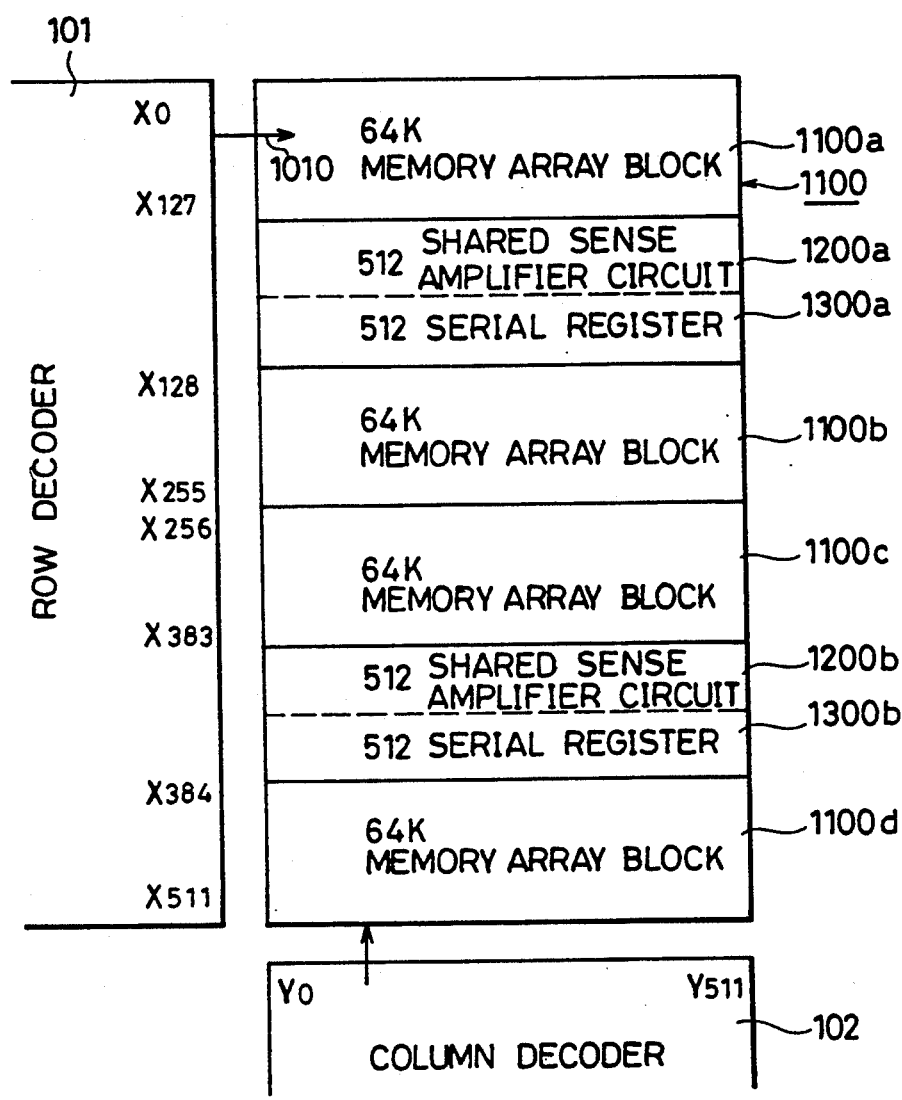
FIG. 15 is a block diagram showing still another arrangement which can be contemplated for a memory array allowing a ¼-divisional operation.
Figure 16:
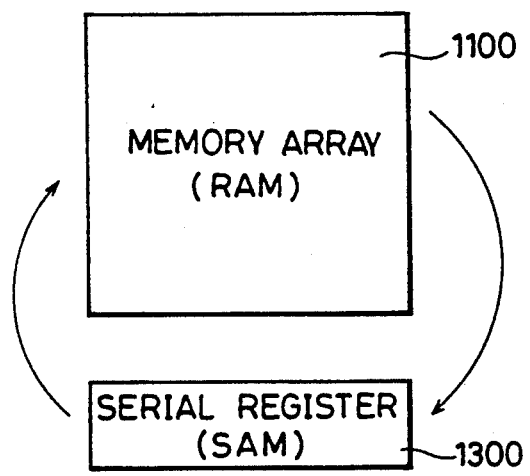
FIG. 16 is a diagram showing a data transfer operation in a conventional dual port memory.
Figure 17:
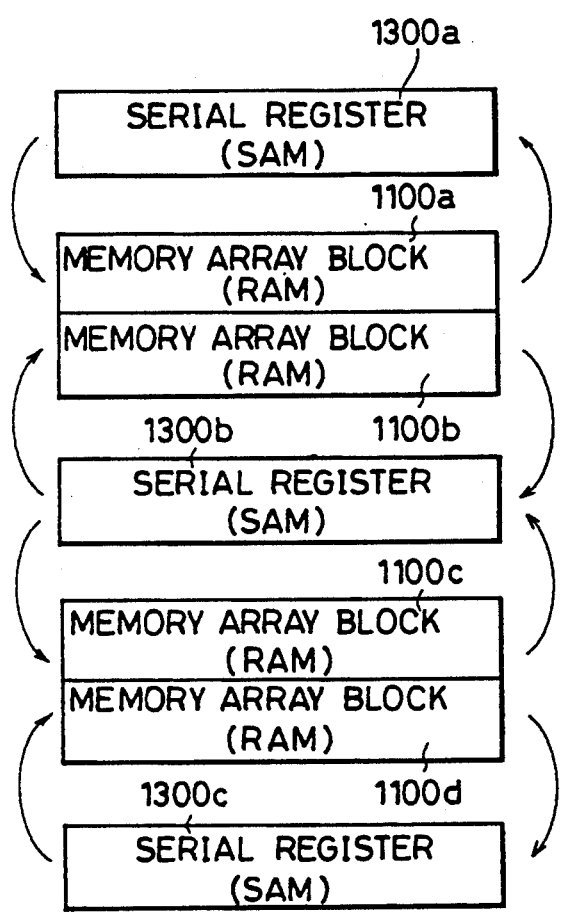
FIG. 17 is a diagram showing a data transfer operation in an arrangement shown in FIG. 13.
Figure 18:
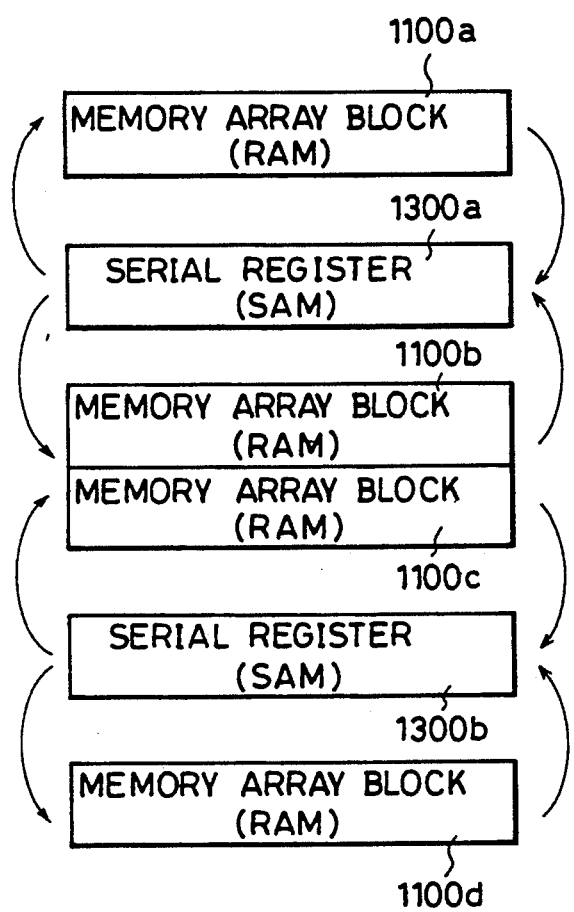
FIG. 18 is a diagram showing a data transfer operation in an arrangement shown in FIG. 15.

The read transfer cycle operation as well as ordinary read and write operations are similar to those of the dual port memory shown in FIGS. 11 and 12.

The embodiment shown in FIG. 8 can be applied to dual port memory shown in FIGS. 1-3.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dual port memory comprising:
   a first memory array including a plurality of memory cells arranged in rows and columns, and being divided into a plurality of blocks;
   amplifier means including a plurality of sense amplifiers disposed between the adjacent two blocks for amplifying data for one row read from any of said blocks or data for one row to be written in any of said blocks;
   a second memory array including a plurality of memory cells arranged in one row, and
   transfer means for transferring the data for one row between said first memory array and said second memory array;
   said plurality of blocks in said first memory array and said second memory array being arranged in a common column; and
   said transfer means including;
   a plurality of transfer lines arranged so as to cross any of said plurality of blocks with each sense amplifier connected to a single transfer line,
   first transfer control means for controlling transfer of data between said amplifier means and said plurality of transfer lines, and
   second transfer control means for controlling transfer of data between said plurality of transfer lines and said second memory array.

2. A dual port memory according to claim 1, further comprising:
   first selection means for selecting any of said plurality of rows in said first memory array for writing or reading data;
   second selection means for selecting any of said columns in said first memory array for writing or reading data; and
   third selection means for sequentially selecting said plurality of memory cells in said second memory array for writing or reading data, wherein
   said transfer means transfers the data between said memory cells in one row in said first memory array selected by said first selection means and said second memory array.

3. A dual port memory according to claim 1, wherein said plurality of blocks include first and second blocks;
   said amplifier means is disposed between said first and second blocks: and
   said dual port memory further comprising selection switch means for selectively coupling said first and second blocks to said amplifier means.

4. A dual port memory according to claim 1, wherein each of said plurality of memory cells included in said first memory array includes a dynamic memory cell, and
   each of said memory cells included in said second memory array includes a static memory cells, respectively.

5. A dual port memory comprising:
   a first memory array including a plurality of memory cells arranged in rows and columns, and being divided into a plurality of blocks;
   amplifier means including a plurality of sense amplifiers disposed between the adjacent two blocks for amplifying data for one row read from any of said blocks or data for one row to be written in any of said blocks;
   a second memory array including a plurality of memory cells arranged in one row, and
   transfer means for transferring the data for one row between said first memory array and said second memory array;
   said plurality of blocks in said first memory array and said second memory array being arranged in a common column; and
   said transfer means including;
   a plurality of transfer lines arranged so as to cross any of said plurality of blocks with each sense amplifier connected to a single transfer line,
   first transfer control means for controlling transfer of data between said amplifier means and said plurality of transfer lines, and
   second transfer control means for controlling transfer of data between said plurality of transfer lines and said second memory array,
   wherein said first transfer switch means connected between said amplifier means and said plurality of transfer lines, and
   control means controlling said plurality of transfer switch means,
   said control means activating at first slowly and then rapidly said plurality of transfer switch means in the data transferring operation from said amplifier means to said second memory array.

6. A dual port memory according to claim 5, wherein said plurality of transfer switch means each include a transistor;
   said control means includes control signal generating means for generating a control signal for controlling each of said transistors; and
   said control signal changes at first slowly and then rapidly, in the data transferring operation from said amplifier means to said second memory array, such that each of said transistors at first slowly and then rapidly turns on.

7. A dual port memory comprising:
   a first memory array including a plurality of memory cells arranged in a plurality of rows and a plurality of columns;
   amplifier means for amplifying data for one row read from said first memory array or data for one row to be written in said first memory array;
   a second memory array including a plurality of memory cells arranged in one row; and
   transfers means for transferring the data for one row between said first memory array and said second memory array, wherein
   said transfer means includes a plurality of transfer switch means connected between said amplifier means and said second memory array, and control means for controlling said plurality of transfer switch means said control means activating, at first slowly and then rapidly, said plurality of transfer switch means in the data transferring operation from said amplifier means to said second memory array.

8. A dual port memory according to claim 7, wherein each of said plurality of transfer switch means includes a transistor;

said control means includes control signal generating means for generating a control signal for controlling each of said transistors, said control signal changing, at first slowly and then rapidly, in data transferring operation from said amplifier means to said second memory array, such that each of said transistors at first slowly and then rapidly turns on.

9. A dual port memory according to claim 7, wherein each of said plurality of memory cells included in said first memory array includes a dynamic memory cell, and each of said plurality of memory cells included in said second memory array includes a static memory cell.

10. A dual port memory comprising:

a first memory array including a plurality of memory cells arranged in a plurality of rows and a plurality of columns;

a second memory array including a plurality of memory cells arranged in one row;

transfer means for transferring the data for one row between said first memory array and said second memory array;

dynamic memory means including a plurality of dynamic memory cells disposed in one row between said first memory array and said transfer means; and control means for activating said transfer means and said dynamic memory means in a data transferring operation from said second memory array to said first memory array, for temporarily storing the data for one row transferred from said second memory array through said transfer means in said dynamic memory means, and thereafter inactivating said transfer means.

11. A dual port memory according to claim 10, further comprising:

first selection means for selecting one of said plurality of rows in said first memory array; and amplifier means for amplifying data for one row read from said first memory array or data for one row to be written in said first memory array; wherein said control means activates said transfer means and said dynamic memory means, then inactivates said transfer means, activates said amplifier means and thereafter activates said first selection means.

12. A dual port memory according to claim 11, further comprising:

second selection means for selecting one of said plurality of columns in said first memory array for writing or reading said data; and third selection means for sequentially selecting said plurality of memory cells in said second memory array for writing or reading said data.

13. A dual port memory according to claim 10, wherein each of said plurality of memory cells included in said first memory array includes a dynamic memory cells, and each of said plurality of memory cells included in said second memory array includes a static memory cells.

14. A dual port memory, comprising:

a first memory array including a plurality of dynamic memory cells arranged in a plurality of rows and a plurality of columns, and divided into a plurality of blocks;

a second memory array including a plurality of dynamic memory cells arranged in a plurality rows and a plurality of columns, and divided into a plurality of blocks;

first amplifier means including a plurality of first sense amplifiers disposed between adjacent two blocks in said first memory array, for amplifying data for one row read from one of the corresponding two blocks or data for one row to be written in one of the corresponding two blocks;

second amplifier means including a plurality of second sense amplifiers disposed between the adjacent two blocks in said second memory array, for amplifying data for one row read from one of the corresponding two blocks or data for one row to be written in one of the corresponding two blocks;

data holding means disposed between said first and second memory arrays and including a plurality of static memory cells arranged in one row;

first transfer means for transferring data for one row between said first memory array and said data holding means; and second transfer means for transferring the data for one row between said second memory array and said data holding means; wherein said plurality of blocks in said first memory array, said blocks in said second memory array and said data holding means are arranged in a common column;

said first transfer means includes a plurality of first transfer lines extending longitudinally across any of said blocks in said first memory array with each first sense amplifiers connected to a single first transfer line, first transfer control means for controlling transfer of data between said first amplifier means and said first plurality of transfer lines, and second transfer control means which controls transfer of the data between said first plurality of transfer lines and said data holding means; and said second transfer means includes a plurality of second transfer lines extending longitudinally across any of said blocks in said second memory array with each second sense amplifier connected to single second transfer line, third transfer control means for controlling transfer of data between said second amplifier means and said plurality of second transfer lines, and fourth transfer control means for controlling transfer of data between said plurality of second transfer lines and said data holding means.

15. A dual port memory, comprising:

a first memory array including a plurality of dynamic memory cells arranged in a plurality of rows and a plurality of columns, and divided into a plurality of blocks;

a second memory array including a plurality of dynamic memory cells arranged in a plurality of rows and a plurality of columns, and divided into a plurality of blocks;

first amplifier means including a plurality of first sense amplifiers disposed between adjacent two blocks in said first memory array, for amplifying data for one row read from one of the corresponding two blocks or data for one row to be written in one of the corresponding two blocks;

second amplifier means including a plurality of second sense amplifiers disposed between the adjacent two blocks in said second memory array, for amplifying data for one row read from one of the corresponding two blocks or data for one row to be written in one of the corresponding two blocks;

data holding means disposed between said first and second memory arrays and including a plurality of static memory cells arranged in one row;

first transfer means for transferring data for one row between said first memory array and said data holding means; and second transfer means for transferring the data for one row between said second memory array and said data holding means; wherein said plurality of blocks in said first memory array, said blocks in said second memory array and said data holding means are arranged in a common column;

said first transfer means includes a plurality of first transfer lines extending longitudinally across any of said blocks in said first memory array with each first sense amplifiers connected to a single first transfer line, first transfer control means for controlling transfer of data between said first amplifier means and said first plurality of transfer lines, and second transfer control means which controls transfer of the data between said first plurality of transfer lines and said data holding means; and said second transfer means includes a plurality of second transfer lines extending longitudinally across any of said blocks in said second memory array with each second sense amplifier connected to single second transfer line, third transfer control means for controlling transfer of data between said second amplifier means and said plurality of second transfer lines, and fourth transfer control means for controlling transfer of data between said plurality of second transfer lines and said data holding means wherein said first transfer control means includes a plurality of first transfer switch means connected between said first amplifier means and said first transfer lines, and first control means for controlling said plurality of first transfer switch means said first control means activating, at first slowly and then rapidly, said plurality of first transfer switch means in a data transferring operation from said first amplifier means to said data holding means;

said third transfer control means includes a plurality of second transfer switch means connected between said second amplifier means and said second transfer lines, and second control means controlling said plurality of second transfer switch means said second control means activating, at first slowly and then rapidly, said plurality of second transfer switch means in a data transferring operation from said second amplifier means to said data holding means.

16. A data transferring method in a dual port memory including a first memory array including a plurality of memory cells arranged in a plurality of rows and a plurality of columns, and divided into a plurality of blocks, amplifier means including a plurality of sense amplifiers disposed between adjacent two blocks, for amplifying data for one row read from any one of said blocks or data for one row to be written in any of said blocks, and second memory array including a plurality of memory cells arranged in one row, said method comprising the steps of:

selecting any of said rows in said first memory array; and transferring data between the selected row in said first memory array and said second memory array through a plurality of transfer lines extending longitudinally across any of said blocks with each sense amplifier connected to a single transfer line.

17. A data transferring method in a dual port memory including a first memory array including a plurality of memory cells arranged in a plurality of rows and a plurality of columns, a second memory array including a plurality of memory cells arranged in one row, and a plurality of transfer switch means coupled between said first memory array and said second memory array, said method comprising the steps of:

selecting any of said rows in said first memory array;

amplifying data read from the selected row; and activating, at first slowly and then rapidly, said plurality of transfer switch means.

18. A data transferring method in a dual port memory, including a first memory array including a plurality of memory cells arranged in a plurality of rows and a plurality of columns, a second memory array including a plurality of memory cells arranged in one row, and transfer means for transferring data between said first memory array and said second memory array, said method comprising the steps of:

activating said transfer means for transferring data from said second memory array;

temporarily storing the data transferred from said transfer means, using dynamic memory means;

inactivating said transfer means; and writing the data stored in said dynamic memory means in the selected one row in said first memory array.

* * * * *